(12) United States Patent
Luo

(10) Patent No.: US 11,411,117 B2
(45) Date of Patent: Aug. 9, 2022

(54) TFT DEVICE, MANUFACTURING METHOD THEREOF, AND TFT ARRAY SUBSTRATE

(71) Applicant: Shenzhen China STAR OPTOELECTRONICS SEMICONDUCTOR DISPLAY TECHNOLOGY CO., LTD., Guangdong (CN)

(72) Inventor: Chuanbao Luo, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/618,827

(22) PCT Filed: Nov. 4, 2019

(86) PCT No.: PCT/CN2019/115245
§ 371 (c)(1),
(2) Date: Dec. 3, 2019

(87) PCT Pub. No.: WO2021/012499
PCT Pub. Date: Jan. 28, 2021

(65) Prior Publication Data
US 2022/0140149 A1    May 5, 2022

(30) Foreign Application Priority Data

Jul. 24, 2019 (CN) .......................... 201910669734.1

(51) Int. Cl.
*H01L 29/786* (2006.01)
*H01L 29/66* (2006.01)

(52) U.S. Cl.
CPC .. *H01L 29/78633* (2013.01); *H01L 29/66742* (2013.01); *H01L 29/7869* (2013.01)

(58) Field of Classification Search
CPC ......... H01L 29/78633; H01L 29/66742; H01L 29/7869
(Continued)

(56) References Cited

U.S. PATENT DOCUMENTS

2004/0155245 A1    8/2004 Okumura
2017/0358688 A1*  12/2017 Lee ..................... H01L 29/7869
(Continued)

FOREIGN PATENT DOCUMENTS

CN    107492555 A    12/2017
CN    108010935 A    5/2018
(Continued)

*Primary Examiner* — Tong-Ho Kim

(57) ABSTRACT

A thin film transistor (TFT) device, a manufacturing method thereof, and a TFT array substrate are provided. A light-shielding layer is provided with a barrier layer for preventing copper ions in a metal layer from diffusing into a buffer layer and an active layer. The barrier layer is also provided with an etch barrier layer for preventing the copper ions of the metal layer being oxidized by a fluorine-based oxidizing gas due to the fluorine-based oxidizing gas is used to dry etch the buffer layer for forming a signal via hole, so as to improve a performance stability of the TFT device. A source is electrically connected to the light-shielding layer through the signal via hole to eliminate a threshold voltage drift of the TFT.

8 Claims, 4 Drawing Sheets

(58) Field of Classification Search
USPC .......................................................... 257/288
See application file for complete search history.

(56) References Cited

U.S. PATENT DOCUMENTS

2018/0123078 A1   5/2018   Byun et al.
2020/0035836 A1   1/2020   Hu et al.

FOREIGN PATENT DOCUMENTS

| CN | 109037346 A | 12/2018 |
| CN | 109887976 A | 6/2019 |

\* cited by examiner

TFT DEVICE, MANUFACTURING METHOD THEREOF, AND TFT ARRAY SUBSTRATE

FIELD OF DISCLOSURE

The present disclosure relates to the field of flat panel display technologies, and in particular, to a TFT device, a manufacturing method thereof, and a TFT array substrate.

BACKGROUND

Metal oxide thin film transistors (TFTs) are widely used in active matrix liquid crystal displays and active matrix organic electroluminescent diodes, which have significant advantages such as ultra-high resolution, large size, high frame rate processing, and high transmittance in the visible range.

A development of high-resolution display panels requires the use of molybdenum and copper in a light-shielding layer of a thin film transistor, and the reduction of trace areas of gate, source, and drain. The copper of the light-shielding layer easily diffuses into a buffer layer and an active layer. As a result, a contact resistance and a parasitic capacitance increase, a threshold voltage drifts, a stability of the thin film transistor is lowered, and a device performance is deteriorated. An appropriate SiNx is introduced as a buffer layer material to reduce the threshold voltage drift, but a vapor deposition of SiNx will influence an etched indium tin oxide (ITO). Also, the buffer layer contacts the source via a signal via hole to compensate for a voltage change of a metal layer. When a fluorine-based oxidizing gas is used to dry etch the buffer layer for forming a hole, the copper ions of the light-shielding layer are oxidized by the fluorine-based oxidizing gas, thereby increasing the contact resistance of the light-shielding layer and the source, and decreasing electrical characteristics of the TFT.

Accordingly, it is necessary to design a TFT device structure to solve technical problems caused by copper in a light-shielding layer of a thin film transistor in the prior art being easily diffused to a buffer layer and an active layer, and the copper ions of the light-shielding layer being oxidized by a fluorine-based oxidizing gas due to the fluorine-based oxidizing gas is used to dry etch the buffer layer for forming a hole, resulting in a contact resistance and a parasitic capacitance of the TFT device increase, and electrical characteristics of the TFT decreases.

SUMMARY OF DISCLOSURE

An object of the present disclosure is to provide a TFT device, a manufacturing method thereof, and a TFT array substrate, which can solve technical problems caused by copper in a light-shielding layer of a thin film transistor in the prior art being easily diffused to a buffer layer and an active layer, and the copper ions of the light-shielding layer being oxidized by a fluorine-based oxidizing gas due to the fluorine-based oxidizing gas is used to dry etch the buffer layer for forming a hole, resulting in a contact resistance and a parasitic capacitance of the TFT device increase, and electrical characteristics of the TFT decreases.

In order to solve the above problems, an embodiment of the present disclosure provides a thin film transistor (TFT) device, including a substrate and a light-shielding layer disposed on the substrate. The light-shielding layer includes a metal layer and a barrier layer which are disposed on the substrate in a layer-by-layer manner, and the barrier layer is configured to prevent copper ions in the metal layer from diffusing into an active layer of the TFT device in a direction away from the substrate.

The barrier layer includes a diffusion barrier layer and an etch barrier layer which are disposed on the metal layer in the layer-by-layer manner.

Material of the diffusion barrier layer includes one or two or more materials selected from the group consisting of molybdenum, titanium, and tantalum.

Material of the etch barrier layer includes indium gallium zinc oxide or indium tin oxide.

Material of the etch barrier layer includes indium gallium zinc oxide, and the etch barrier layer is a conductive conducting layer.

A signal via hole corresponding to a top of the light-shielding layer is formed on an interlayer dielectric layer and a buffer layer of the TFT device, and a source of the TFT device is electrically connected to the barrier layer through the signal via hole.

In order to solve the above problems, an embodiment of the present disclosure also provides a manufacturing method of a thin film transistor (TFT) device, including:

step S10, providing a substrate; and step S20, disposing a metal layer and a barrier layer on the substrate in a layer-by-layer manner to form a light-shielding layer.

In the step S20, the method further includes:

step S201, forming a diffusion barrier layer on the metal layer; and step S202, forming an etch barrier layer on the diffusion barrier layer.

Material of the etch barrier layer includes indium gallium zinc oxide, and the etch barrier layer is subjected to a conductive treatment to reduce an oxygen element content in a metal oxide semiconductor material, such that a resistivity of the metal oxide semiconductor material is reduced to become a conductor.

According to the above object, the present disclosure further provides a thin film transistor (TFT) array substrate including a TFT device. The TFT device includes a substrate and a light-shielding layer disposed on the substrate, the light-shielding layer includes a metal layer and a barrier layer which are disposed on the substrate in a layer-by-layer manner, and the barrier layer is configured to prevent copper ions in the metal layer from diffusing into an active layer of the TFT device in a direction away from the substrate.

Advantages of the present disclosure are as follows. The light-shielding layer is provided with the barrier layer for preventing copper ions in the metal layer of the light-shielding layer from diffusing into the buffer layer and the active layer. The barrier layer is provided with the etch barrier layer for preventing the copper ions of the metal layer being oxidized by a fluorine-based oxidizing gas due to the fluorine-based oxidizing gas is used to dry etch the buffer layer for forming the signal via hole. Also, a continued diffusion of the copper ions is prevented. The source is electrically connected to the etch barrier layer through the signal via hole to eliminate the threshold voltage drift of the TFT, thereby improving the electrical characteristics and stability of the TFT device.

BRIEF DESCRIPTION OF DRAWINGS

To illustrate the technical solutions according to the embodiments of the present disclosure more clearly, the accompanying drawings for describing the embodiments are introduced briefly in the following. Apparently, the accom

DETAILED DESCRIPTION

Below a definite and complete description will be made on technical solutions according to embodiments of the present disclosure with reference to the accompanying drawings of embodiments of the present disclosure. Apparently, the described embodiments are merely some but not all of the embodiments of the present disclosure. Based on the embodiments of the present disclosure, all other embodiments obtained by one of ordinary skill in the art without making creative effort shall all fall within the protection scope of the present disclosure.

The present disclosure can solve technical problems caused by copper in a light-shielding layer of a thin film transistor in the prior art being easily diffused to a buffer layer and an active layer, and the copper ions of the light-shielding layer being oxidized by a fluorine-based oxidizing gas due to the fluorine-based oxidizing gas is used to dry etch the buffer layer for forming a hole, resulting in a contact resistance and a parasitic capacitance of the TFT device increase, and electrical characteristics of the TFT decreases.

Figure 1:
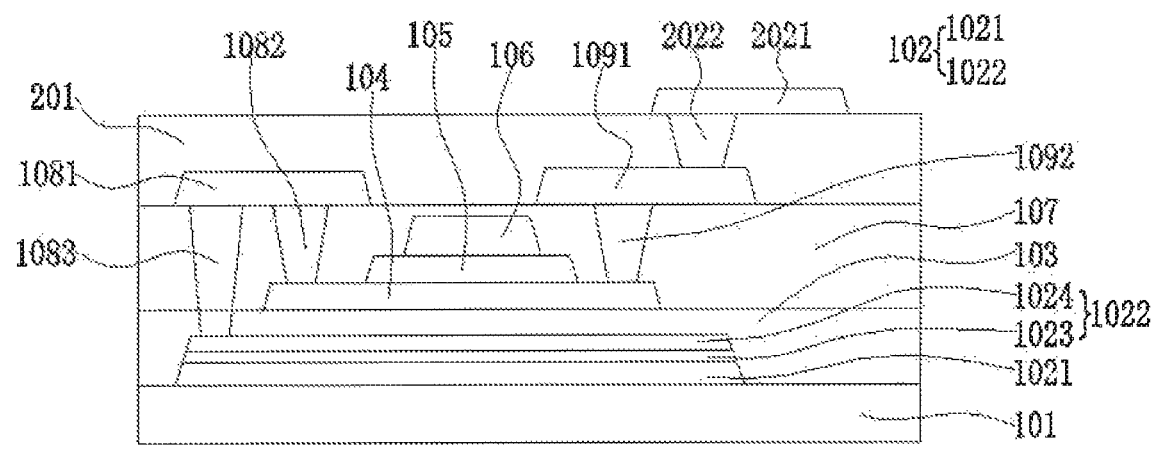
- FIG. 1 is a schematic diagram of a TFT device of an embodiment of the present disclosure.

As shown in FIG. 1, the present disclosure provides a TFT device 100 including a substrate 101 and a light-shielding layer 102 disposed on the substrate 101. The light-shielding layer 102 includes a metal layer 1021 and a barrier layer 1022 which are sequentially disposed on the substrate 101. The barrier layer 1022 is used to prevent copper ions in the metal layer 1021 from diffusing into an active layer 104 of the TFT device 100 in a direction away from the substrate 101, which may cause an increase in the contact resistance and parasitic capacitance of the TFT device 100, and affect electrical characteristics of the TFT device 100.

Specifically, the TFT device 100 includes the light-shielding layer 102, a buffer layer 103, the active layer 104, a gate insulating layer 105, a gate 106, an interlayer dielectric layer 107, a source 1081, a drain 1091, a passivation layer 201, and a pixel electrode layer 2021. The light-shielding layer 102 is disposed on the substrate 101. The buffer layer 103 is disposed on the substrate 101 and covers the light-shielding layer 102. The active layer 104 is disposed on the buffer layer 103. The gate insulating layer 105 is disposed on the active layer 104. The gate 106 is disposed on the gate insulating layer 105. The interlayer dielectric layer 107 is disposed on the buffer layer 103 and covers the gate 106 and the active layer 104. The source 1081 and the drain 1091 are disposed on the interlayer dielectric layer 107. The passivation layer 201 is disposed on the interlayer dielectric layer 107 and covers the source 1081 and the drain 1091. The pixel electrode layer 2021 is disposed on the passivation layer 201.

The interlayer dielectric layer 107 and the buffer layer 103 are provided with a signal via hole 1083 corresponding to the light-shielding layer 102. The active layer 104 includes a channel region corresponding to a below of the gate insulating layer 105 and source and drain contact regions respectively located on both sides of the channel region. Material of the source contact region and the drain contact region is a conductive metal oxide semiconductor material. Material of the channel region is a metal oxide semiconductor material that maintains semiconductor characteristics. A source contact hole 1082 and a drain contact hole 1092 corresponding to the source contact region and the drain contact region are respectively disposed on the interlayer dielectric layer 107. The interlayer dielectric layer 107 and the buffer layer 103 are provided with a signal via hole 1083 corresponding to the light-shielding layer 102. The source 1081 and the drain 1091 are electrically connected to the source contact region and the drain contact region of the active layer 104 through the source contact hole 1082 and the drain contact hole 1092. The source 1081 is electrically connected to the light-shielding layer 102 through the signal via hole 1083. The pixel electrode layer 2021 is connected to the drain 1091 through a pixel via 2022 of the passivation layer 201. An orthographic projection of the light-shielding layer 102 on the substrate 101 covers an orthographic projection of the active layer 104 on the substrate 100, so that the light-shielding layer 102 completely covers the active layer 104, thereby preventing the active layer 104 from being exposed to light, and avoiding a negative drift in the threshold voltages of the TFT device 100.

In order to solve the problems that the copper ions in the metal layer 1021 of the light-shielding layer 102 are diffused into the buffer layer 103 and the active layer 104, the contact resistance and parasitic capacitance of the TFT are increased, the threshold voltage is drifted, the stability of the TFT device is degraded, and a performance is deteriorated, a display quality of the display panel is affected, the embodiment of the present disclosure providing the barrier layer 1022 on the metal layer 1021 of the light-shielding layer 102 to prevent the copper ions from diffusing from the metal layer 1021. The material of the barrier layer 1022 is preferably a metal such as molybdenum, titanium or tantalum which does not greatly differ from the property of aluminum.

In order to prevent the copper ions in the metal layer 1021 to be oxidized by the fluorine-based oxidizing gas due to the fluorine-based oxidizing gas is used for forming the signal via hole 1083 on the buffer layer 103, the barrier layer 1022 includes a diffusion barrier layer 1023 and an etch barrier layer 1024 which are sequentially disposed on the metal layer 1021. Both the diffusion barrier layer 1023 and the etch barrier layer 1024 can prevent the copper ions in the metal layer 1021 from diffusing into the buffer layer and the active layer. Material of the etch barrier layer 1024 includes indium gallium zinc oxide or indium tin oxide. In—O bonds of $In_2O_3$ in the indium gallium zinc oxide forms energy barriers of diffusion of the copper ions to form In—O—Cu grids, which further prevents the copper ions from continuing to diffuse. The indium tin oxide contains an In—O structure, which prevents the copper ions from entering the buffer layer 103 to an interface of the active layer 104 so as to increase the energy barriers. The etch barrier layer 1024 is also used to prevent the copper ions in the metal layer 1021 from being oxidized.

When the material of the etch barrier layer 1024 is indium tin oxide, the etch barrier layer 1024 itself can serve as a conductor, and the source 1081 is electrically connected to the etch barrier layer 1024 through the signal via hole 1083.

When the material of the etch barrier layer 1024 is indium gallium zinc oxide, the indium gallium zinc oxide is a semiconductor material, and its conductivity is poor. In order to improve the conductivity of the etch barrier layer 1024, the etch barrier layer 1024 needs to be subjected to a conductive treatment. The etch barrier layer 1024 is subjected to the conductive treatment using plasma to reduce an oxygen element content in the metal oxide semiconductor material of the etch barrier layer 1024 such that an electrical resistivity of the metal oxide semiconductor material is decreased to become a conductor. The plasma includes one or two or more plasmas selected from the group consisting of a helium plasma, an argon plasma, and an ammonia plasma.

The light-shielding layer of the TFT device is provided with the barrier layer for preventing copper ions in the metal layer of the light-shielding layer from diffusing into the buffer layer and the active layer, resulting in a contact resistance and a parasitic capacitance of the TFT device increase, and a threshold voltage drift. The barrier layer is also provided with the etch barrier layer for preventing the copper ions of the metal layer being oxidized by a fluorine-based oxidizing gas due to the fluorine-based oxidizing gas is used to dry etch the buffer layer for forming the signal via hole. Also, a continued diffusion of the copper ions is prevented. The source is electrically connected to the etch barrier layer through the signal via hole to eliminate a voltage variation of the metal layer of the light-shielding layer to ensure electrical characteristics and stability of the TFT device.

Figure 2:
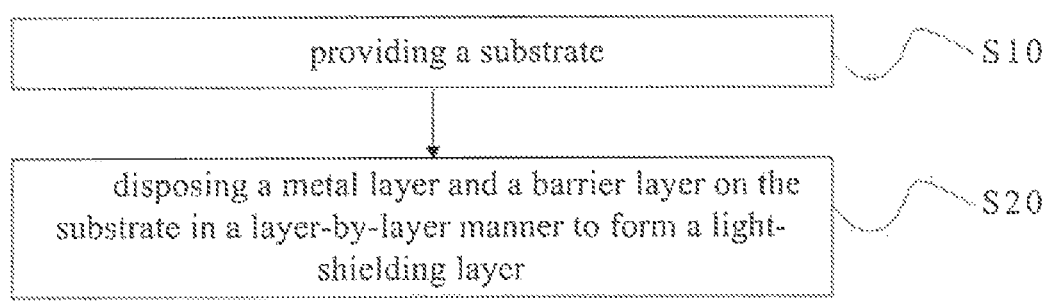
FIG. 2 is a flowchart showing a manufacturing method of a TFT device of an embodiment of the present disclosure.

According to the above TFT device, as shown in FIG. 2, an embodiment of the present disclosure provides a flowchart showing a manufacturing method of a TFT device. The method includes the following.

In a step S10, a substrate is provided.

In a step S20, a metal layer and a barrier layer are sequentially formed on the substrate to form a light-shielding layer.

Preferably, in the step S20, the method further includes the following.

In a step S201, a diffusion barrier layer is formed on the metal layer.

In a step S202, an etch barrier layer is formed on the diffusion barrier layer.

Preferably, material of the etch barrier layer includes indium gallium zinc oxide, and the etch barrier layer is subjected to a conductive treatment to reduce an oxygen element content in a metal oxide semiconductor material, such that a resistivity of the metal oxide semiconductor material is reduced to become a conductor.

Specifically, an embodiment of the present disclosure provides a manufacturing method of the TFT device, including the following.

Figure 3A:
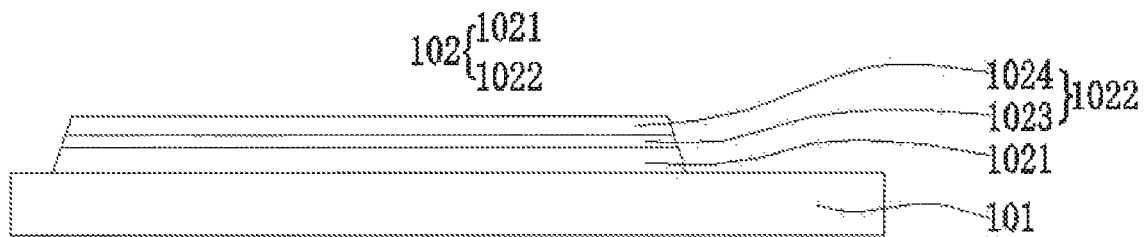
FIG. 3a is a schematic diagram of forming a light-shielding layer of the TFT device of the embodiment of the present disclosure.

As shown in FIG. 3a, a substrate 101 is provided. A metal layer 1021 and a barrier layer 1022 are sequentially formed on the substrate 101 by a physical vapor deposition method to form a light-shielding layer 102. The barrier layer 1022 includes a diffusion barrier layer 1023 and an etch barrier layer 1024 which are sequentially disposed on the metal layer. Material of the metal layer 1021 is a metal, preferably a metal material such as molybdenum (Mo), aluminum (Al), copper (Cu), or titanium (Ti). Material of the diffusion barrier layer 1023 includes one or two or more materials selected from the group consisting of molybdenum, titanium, and tantalum. Material of the etch barrier layer includes indium gallium zinc oxide or indium tin oxide.

Figure 3B:
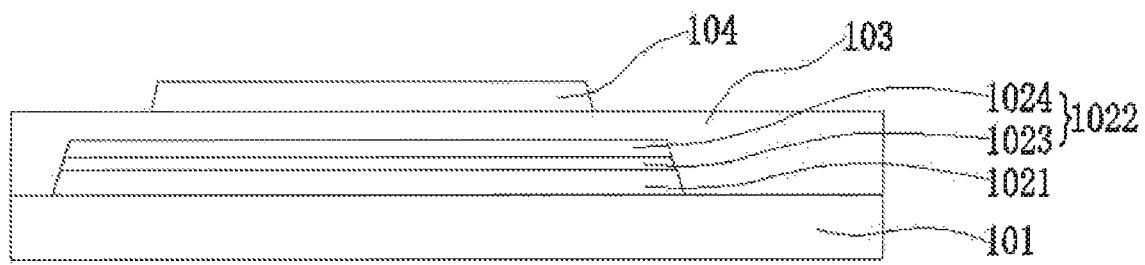
FIG. 3b is a schematic diagram forming an active layer of the TFT device of the embodiment of the present disclosure.

As shown in FIG. 3b, the buffer layer 103 covering the light-shielding layer 102 is formed on the substrate 101. The active layer 104 is formed on the buffer layer 103. The buffer layer 103 includes a silicon oxide (SiOx) film, a silicon nitride (SiNx) film, or a composite film in which a silicon oxide film and a silicon nitride film are alternately laminated. Material of the active layer 104 includes one or two or more materials selected from the group consisting of indium gallium zinc oxide, indium zinc tin oxide, and indium gallium zinc tin oxide. The active layer 104 is deposited on the buffer layer 103 by a method of magnetron sputtering, metal organic chemical vapor deposition, or pulsed laser evaporation. After the deposition of the active layer 104 is completed, an annealing treatment is performed, and the annealing treatment can be performed in a dry air atmosphere at 400° C. for about 0.5 hours.

After the annealing treatment is completed, the active layer 104 is etched by a wet etching process or a dry etching process using oxalic acid as an etching solution. After the etching process, an entire metal oxide film of the active layer 104 is patterned to form a metal oxide semiconductor layer having an island shape.

Figure 3C:
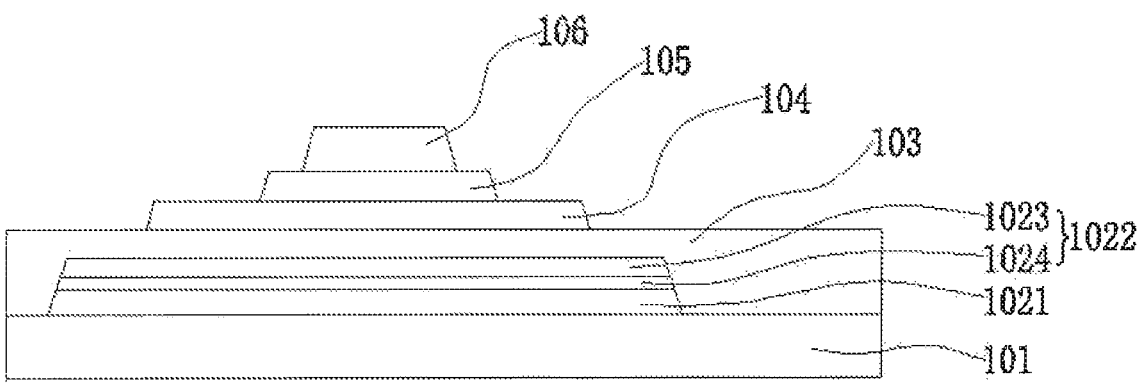
FIG. 3c is a schematic diagram of forming a gate of the TFT device of the embodiment of the present disclosure.

As shown in FIG. 3c, the gate insulating layer 105 is disposed on the active layer 104, and the gate 106 is disposed on the gate insulating layer 105. Material of the gate insulating layer 105 is generally silicon oxide (SiOx), silicon nitride (SiNx), silicon oxynitride (SiON), or a sandwich structure of the three. Material of the gate 106 is a metal material such as copper (Cu), aluminum (Al), titanium (Ti), tantalum (Ta), tungsten (W), molybdenum (Mo), chromium (Cr) or the like. The gate 106 is formed on the gate insulating layer 105 by a physical vapor deposition method, and then the gate 106 is subjected to a lithography process to form a gate pattern. Material of the gate 106 may be a metal material such as copper (Cu), aluminum (Al), titanium (Ti), tantalum (Ta), tungsten (W), molybdenum (Mo), chromium (Cr), or the like.

Figure 3D:
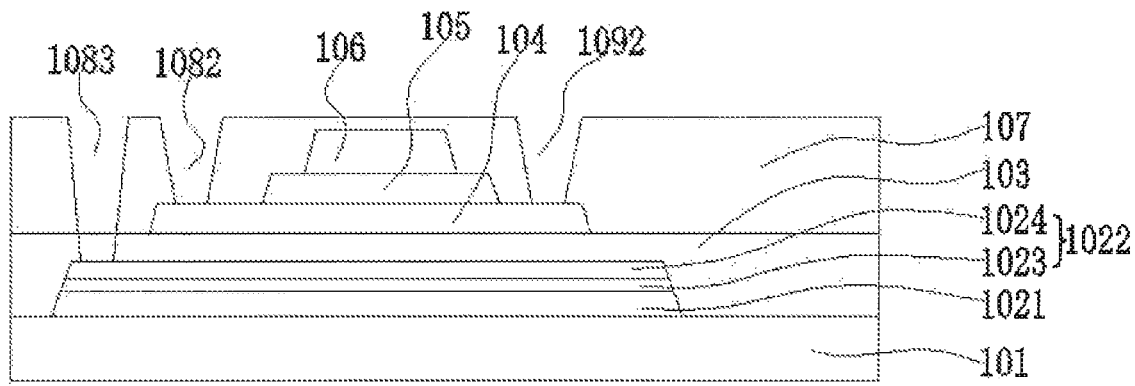
FIG. 3d is a schematic diagram of forming an interlayer dielectric layer of the TFT device of the embodiment of the present disclosure.

As shown in FIG. 3d, an interlayer dielectric layer 107 covering the gate 106 and the active layer 104 is formed on the buffer layer 103. A signal via hole 1083 is formed on the interlayer dielectric layer 107 and the buffer layer 103 corresponding to the light-shielding layer 102 using a fluorine-based oxidizing gas. A source contact hole 1082 is formed on the interlayer dielectric layer 107 corresponding to a source doped region using the fluorine-based oxidizing gas. A drain contact hole 1092 is formed on the interlayer dielectric layer 107 corresponding to a drain doping region using the fluorine-based oxidizing gas.

Figure 3E:
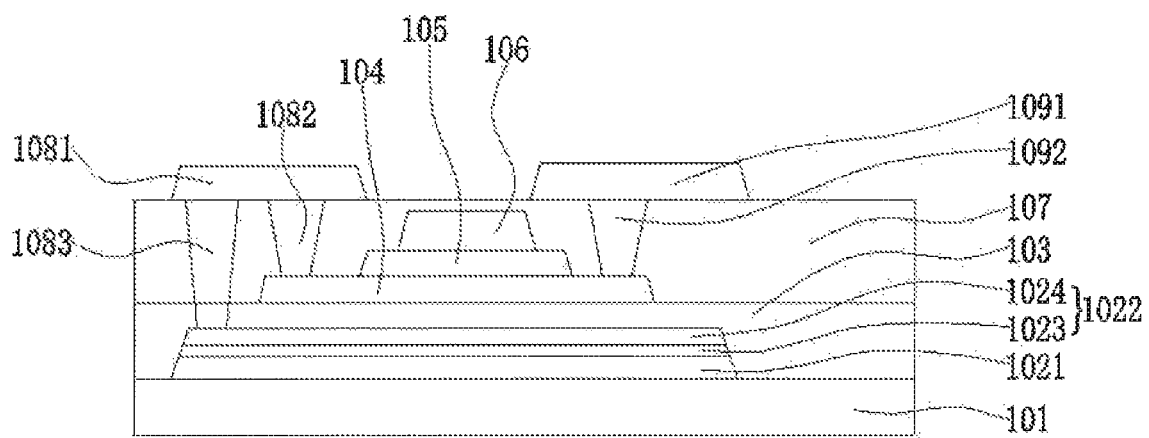
FIG. 3e is a schematic diagram of forming a source and a drain of the TFT device of the embodiment of the present disclosure.

As shown in FIG. 3e, the source 1081 and the drain 1091 are formed on the interlayer dielectric layer 107. The source 1081 is electrically connected to the source doped region through the source contact hole 1082 of the interlayer dielectric layer 107. The drain 1091 is electrically connected to the drain doped region through the drain contact hole 1092 of the interlayer dielectric layer 107. The source 1081 is electrically connected to the light-shielding layer 102 through the signal via hole 1083.

Figure 3F:
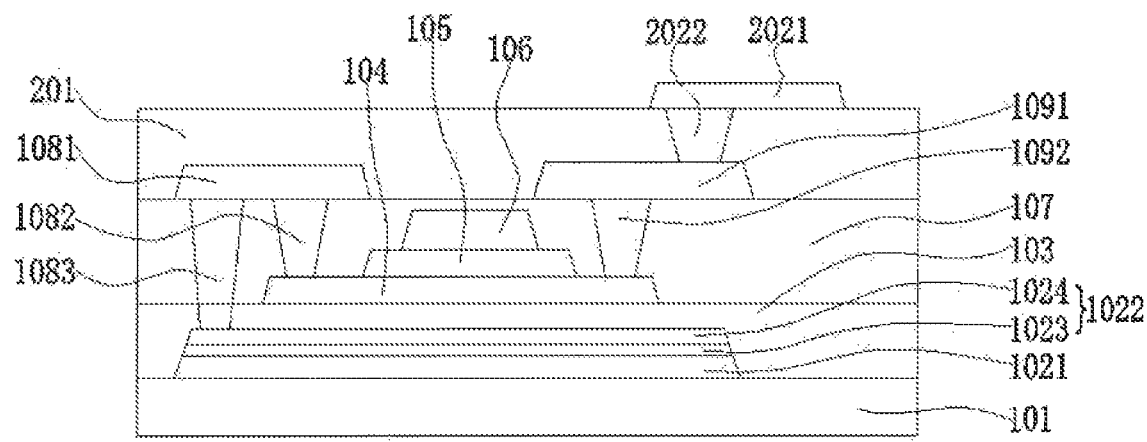
FIG. 3f is a schematic diagram of forming a passivation layer of the TFT device of the embodiment of the present disclosure.

As shown in FIG. 3f, a passivation layer 201 covering the source 1081 and the drain 1091 is formed on the interlayer dielectric layer 107. A pattern of the passivation layer 201 is formed by a photolithography process. On the passivation layer 201, a pattern of the pixel electrode layer 2021 is formed by a photolithography process. A pixel electrode layer 2021 is formed by using an oxalic acid-based chemical solution as an etchant. The pixel electrode layer 2021 is connected to the drain 1091 through a pixel via 2022 on the passivation layer 201.

According to the above object of the present disclosure, a TFT array substrate is provided, which includes the TFT device of the above embodiments. The TFT device includes a substrate and a light-shielding layer disposed on the substrate. The light-shielding layer includes a metal layer and a barrier layer which are disposed on the substrate in a layer-by-layer manner, and the barrier layer is configured to prevent copper ions in the metal layer from diffusing into an active layer of the TFT device in a direction away from the substrate.

Advantages of the present disclosure are as follows. The light-shielding layer is provided with the barrier layer for preventing copper ions in the metal layer of the light-shielding layer from diffusing into the buffer layer and the active layer, resulting in a contact resistance and a parasitic capacitance of the TFT device increase, and a threshold voltage drift. The barrier layer is also provided with the etch barrier layer for preventing the copper ions of the metal layer being oxidized by a fluorine-based oxidizing gas due to the fluorine-based oxidizing gas is used to dry etch the buffer layer for forming the signal via hole. Also, a continued diffusion of the copper ions is prevented. The source is electrically connected to the etch barrier layer through the signal via hole to eliminate the threshold voltage drift of the TFT, thereby improving the electrical characteristics and stability of the TFT device.

The present disclosure has been described with a preferred embodiment thereof and it is understood that many changes and modifications to the described embodiment can be carried out without departing from the scope and the spirit of the disclosure that is intended to be limited only by the appended claims.

What is claimed is:

1. A thin film transistor (TFT) device, comprising a substrate and a light-shielding layer disposed on the substrate, wherein the light-shielding layer comprises a metal layer and a barrier layer which are disposed on the substrate in a layer-by-layer manner, and the barrier layer is configured to prevent copper ions in the metal layer from diffusing into an active layer of the TFT device in a direction away from the substrate.

2. The TFT device as claimed in claim 1, wherein the barrier layer comprises a diffusion barrier layer and an etch barrier layer which are disposed on the metal layer in the layer-by-layer manner.

3. The TFT device as claimed in claim 2, wherein material of the diffusion barrier layer comprises one or two or more materials selected from the group consisting of molybdenum, titanium, and tantalum.

4. The TFT device as claimed in claim 2, wherein material of the etch barrier layer comprises indium gallium zinc oxide or indium tin oxide.

5. The TFT device as claimed in claim 2, wherein material of the etch barrier layer comprises indium gallium zinc oxide, and the etch barrier layer is a conductive conducting layer.

6. The TFT device as claimed in claim 1, wherein a signal via hole corresponding to a top of the light-shielding layer is formed on an interlayer dielectric layer and a buffer layer of the TFT device, and a source of the TFT device is electrically connected to the barrier layer through the signal via hole.

7. A manufacturing method of a thin film transistor (TFT) device, comprising:
   step S10, providing a substrate; and
   step S20, disposing a metal layer and a barrier layer on the substrate in a layer-by-layer manner to form a light-shielding layer;
   wherein in the step S20, the method further comprises:
   step S201, forming a diffusion barrier layer on the metal layer; and
   step S202, forming an etch barrier layer on the diffusion barrier layer; and
   wherein material of the etch barrier layer comprises indium gallium zinc oxide, and the etch barrier layer is subjected to a conductive treatment to reduce an oxygen element content in a metal oxide semiconductor material, such that a resistivity of the metal oxide semiconductor material is reduced to become a conductor.

8. A thin film transistor (TFT) array substrate, comprising a TFT device, wherein the TFT device comprises a substrate and a light-shielding layer disposed on the substrate, the light-shielding layer comprises a metal layer and a barrier layer which are disposed on the substrate in a layer-by-layer manner, and the barrier layer is configured to prevent copper ions in the metal layer from diffusing into an active layer of the TFT device in a direction away from the substrate.

* * * * *